United States Patent
Okoroanyanwu

(10) Patent No.: US 6,589,713 B1
(45) Date of Patent: Jul. 8, 2003

(54) PROCESS FOR REDUCING THE PITCH OF CONTACT HOLES, VIAS, AND TRENCH STRUCTURES IN INTEGRATED CIRCUITS

(75) Inventor: Uzodinma Okoroanyanwu, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 33 days.

(21) Appl. No.: 09/771,820

(22) Filed: Jan. 29, 2001

(51) Int. Cl.$^7$ .............................. G03F 7/00; G03F 7/22
(52) U.S. Cl. ...................... 430/313; 430/311; 430/312; 430/328; 430/394; 430/296; 430/942
(58) Field of Search ................. 430/311, 312, 430/313, 328, 394, 296, 942

(56) References Cited

U.S. PATENT DOCUMENTS

| | | | | |
|---|---|---|---|---|
| 4,904,866 A | * | 2/1990 | Collins et al. | 250/492.2 |
| 5,003,178 A | | 3/1991 | Livesay | 250/492.3 |
| 5,573,634 A | * | 11/1996 | Ham | 438/700 |
| 5,965,461 A | | 10/1999 | Yang et al. | 438/717 |
| 6,103,457 A | | 8/2000 | Gabriel | 430/318 |
| 6,107,172 A | | 8/2000 | Yang et al. | 438/585 |
| 6,271,127 B1 | | 8/2001 | Liu et al. | 438/638 |
| 6,319,824 B1 | | 11/2001 | Lee et al. | 438/639 |

FOREIGN PATENT DOCUMENTS

JP    57-88729    *    6/1982

OTHER PUBLICATIONS

Livesay, W. R., "*Large–area electron–beam source,*" Journal of Vacuum Science & Technology B, vol. 11, No. 6, Nov./Dec. 1993, pp. 2304–2308, American Vacuum Society.

Yang, J. J. et al, "*Electron Beam Processing for Spin–on Polymers and its Applications to Back–End–of–Line (BEOL) Integration,*" Materials Research Society Symposium Proceedings, vol. 511, 1998, pp. 49–55, Materials Research Society.

Ross et al, "*Plasma Etch Characteristics of Electron Beam Processed Photoresist,*" The Society of Photo–Optical Instrumentation Engineers, vol. 2438, 1995, pp. 803–816, SPIE–The International Society for Optical Engineering.

Grün, Von A. E., "*Lumineszenz–photometrische Messungen der Energieabsorption im Strahlungsfeld von Elektronenquellen Eindimensionaler Fall in Luft,*" Zeitschrift für Naturforschung, vol. 12a, 1957, pp. 89–95, Publisher: Zeitschrift für Naturforschung; full English Translation attached (11 pgs).

* cited by examiner

Primary Examiner—Mark F. Huff
Assistant Examiner—Nicole Barreca
(74) Attorney, Agent, or Firm—Foley & Lardner

(57) ABSTRACT

An integrated circuit fabrication process to pattern features having reduced pitch is disclosed herein. The process includes reducing the width of a developed exposed area of a patterned photoresist layer provided over a substrate before patterning the substrate. The process further includes additionally patterning the patterned photoresist layer using the previously used mask or reticle to form a first feature and a second feature. The distance between adjacent first and second features is smaller than the distance between either of adjacent first features or adjacent second features.

28 Claims, 4 Drawing Sheets

PROCESS FOR REDUCING THE PITCH OF CONTACT HOLES, VIAS, AND TRENCH STRUCTURES IN INTEGRATED CIRCUITS

CROSS-REFERENCE TO RELATED APPLICATIONS

The present invention is related to U.S. application Ser. No. 09/771,842 by Uzodinma Okoroanyanwu entitled "Process for Reducing Critical Dimensions of Contact Holes, Vias, and Trench Structures in Integrated Circuits" filed on an even date herewith and assigned to the Assignee of the present application.

FIELD OF THE INVENTION

The present invention relates generally to pitch size in integrated circuits (ICs). More particularly, the present invention relates to a process for fabricating reduced pitch size in integrated circuits.

BACKGROUND OF THE INVENTION

The semiconductor or integrated circuit (IC) industry aims to manufacture integrated circuits (ICs) with higher and higher densities of devices on a smaller chip area to achieve greater functionality and to reduce manufacturing costs. This desire for large scale integration has led to continued shrinking of circuit dimensions and device features. The ability to reduce the size of structures, such as, gate lengths in field-effect transistors and the width of conductive lines, is driven by lithographic performance.

Feature size has been steadily decreasing with the help of shorter lithographic or exposure wavelengths and resolution enhancement techniques, such as, phase shifting marks and off-axis illumination. In contrast, the distance between adjacent feature/space combinations, i.e., the pitch, has proven more difficult to reduce. Even using shorter lithographic wavelengths and various resolution enhancement techniques, the pitch is usually constrained, at best, to a dimension approximately equal to the lithographic wavelength.

Presently, with 193 nanometer (nm) lithographic systems, the minimum achievable pitch is approximately 300 nm. And with shorter lithographic wavelengths (e.g., 157, 126, or 13.4 nm), proximity effect further constrains fabrication of smaller pitches in ICs.

Thus, there is a need for a method and apparatus of fabricating an integrated circuit having a pitch smaller than the lithographic wavelength associated therewith. There is a further need for a method of and apparatus for fabricating an integrated circuit having a reduced pitch that utilize existing equipment and materials and do not significantly decrease throughout.

BRIEF SUMMARY OF THE INVENTION

An exemplary embodiment relates to a method of fabricating reduced pitch in an integrated circuit. The integrated circuit includes a patterned photoresist layer. The patterned photoresist layer is patterned in accordance with a pattern on a mask or reticle and exposed to a first radiation at a lithographic wavelength. The method includes providing a second radiation to at least one area of the patterned photoresist layer. The patterned photoresist layer includes a developed exposed area, the developed exposed area including sidewalls and a bottom. The method further includes transforming the sidewalls of the developed exposed area to change the width of the developed exposed area in response to the second radiation. The method still further includes positioning the pattern on the mask or reticle relative to the patterned photoresist layer so that the pattern on the mask or reticle is not aligned with the patterned photoresist layer.

Another exemplary embodiment relates to an integrated circuit fabrication process. The process includes changing a first aperture formed on a photoresist layer provided over a semiconductor substrate. The process further includes forming a second aperture on the photoresist layer in accordance with a mask or reticle used to form the first aperture. The mask or reticle is not in alignment with the first aperture formed on the photoresist layer. The first aperture defines a first feature in the substrate and the second aperture defines a second feature in the substrate.

Still another exemplary embodiment relates to an integrated circuit fabrication process. The process includes (a) reducing a width associated with a current patterned area in a photoresist layer provided over a substrate. The process further includes (b) patterning the substrate in accordance with the reduced width current patterned area in the photoresist layer, to form a current set of features in the substrate. The process still further includes (c) transferring a pattern on a mask or reticle onto the photoresist layer to form the next current set of features in the substrate, and (d) repeating steps (a)–(c) a plurality of times, as desired. All of the sets of features are similar to each other. A density of the features formed on the substrate is greater than a density of the features provided as the pattern on the mask or reticle. The reducing step (a) includes melting and flowing sidewalls of the current patterned area.

BRIEF DESCRIPTION OF THE DRAWINGS

The preferred embodiment will become more fully understood from the following detailed description, taken in conjunction with the accompanying drawings, wherein like reference numerals denote like elements, in which.

DETAILED DESCRIPTION OF THE EXEMPLARY EMBODIMENTS

With reference to FIGS. 1–10, an exemplary embodiment of an advantageous process for fabricating reduced pitch in an integrated circuit (IC) will be described. The advantageous process is preferably implemented to fabricate reduced feature pitches for features such as trenches, doped regions, spacers, contacts, and/or vias. The advantageous process permits the pitch to be reduced by at least one-half that of pitches achievable using conventional lithographic techniques and systems.

Figure 1:
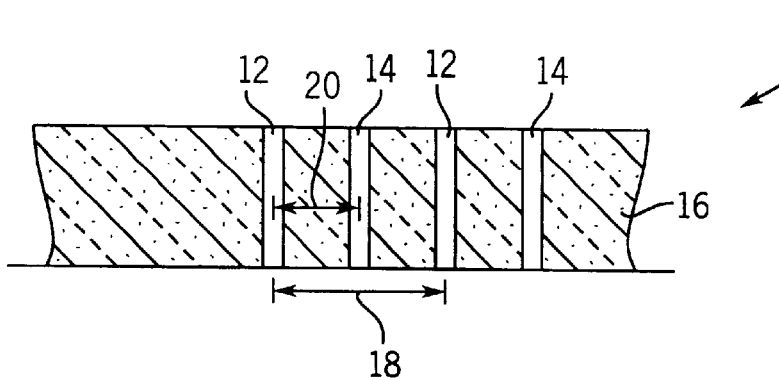
FIG. 1 is a cross-sectional view of a portion of an integrated circuit in accordance with an exemplary embodiment, showing a reduced pitch.

With reference to FIG. 1, a portion 10 of an integrated circuit (IC) includes etched areas 12 and 14 in a substrate 16. The distance from the center of a given etched area 12 to the center of an adjacent etched area 12 is a conventional pitch 18. The distance from the center of a given etched area 12 to the center of an adjacent etched area 14 is a reduced pitch 20.

In FIG. 1, reduced pitch 20 is approximately half the dimension of conventional pitch 18. For example, in a 193 nm lithography system with numerical aperture=0.63, conventional pitch 18 may be approximately 300 nm and reduced pitch 20 may approach 150 nm. However, it is contemplated that reduced pitch 20 may be less than half of conventional pitch 18. Among others, the feature or structure size, the dimension of conventional pitch 18, the characteristics of the photoresist material used to fabricate etched areas 12, 14, and/or the density of features or structures provided on a mask used to fabricate etched areas 12, 14 determine the possible minimum reduced pitch 20 for a given IC.

Figure 2:
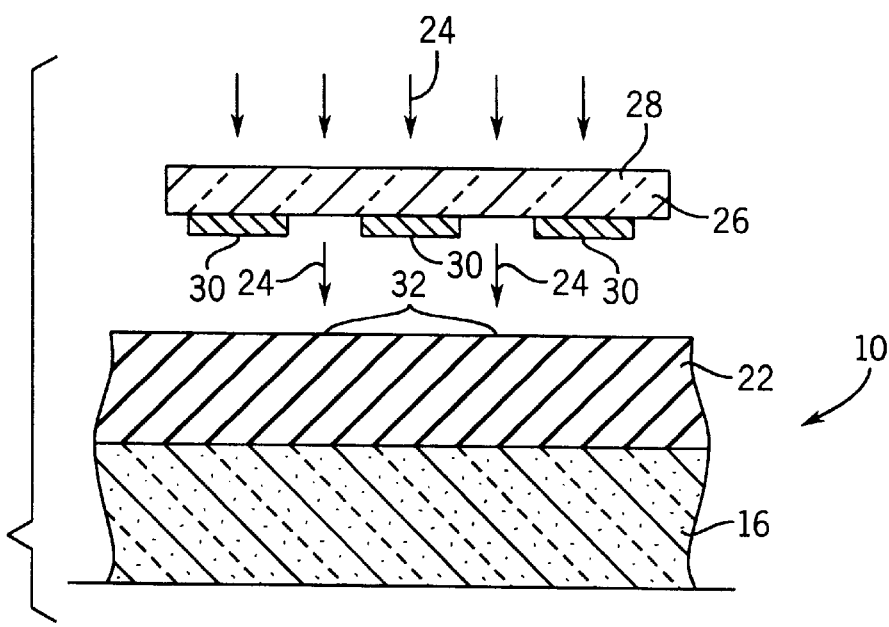
FIG. 2 is a cross-sectional view of the portion of the integrated circuit illustrated in FIG. 1, showing a first exposure step of a first photoresist coated layer.
Figure 3:
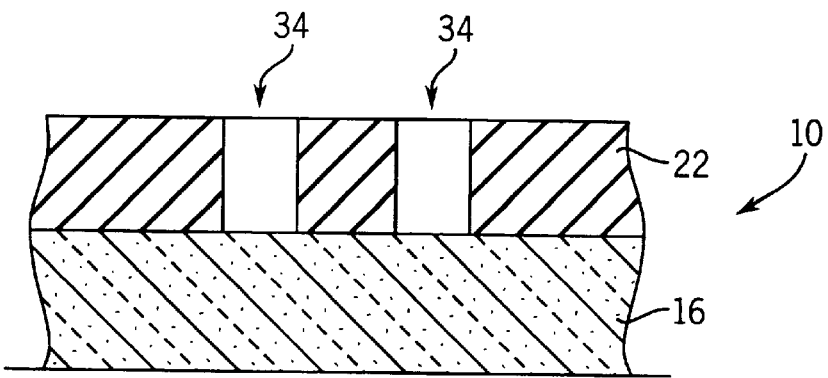
FIG. 3 is a cross-sectional view of the portion of the integrated circuit illustrated in FIG. 2, showing a first developing step.

The fabrication of etched areas 12, 14 having conventional and reduced pitches 18, 20 will be described with respect to FIGS. 2–10. With reference to FIG. 2, a first exposure step comprising the advantageous process is performed on portion 10 of the IC. Portion 10 includes a photoresist layer 22 provided on substrate 16. Substrate 16 can be an IC wafer, a semiconductive material, an insulative material, a conductive material, layers above any of the listed materials, or a base layer. Substrate 16 can be an industry standard silicon wafer. Substrate 16 can include one or more layers of materials and/or features, such as, lines, interconnects, vias, doped regions, etc., and can further include devices, such as, transistors, microactuators, microsensors, capacitors, resistors, diodes, etc. Substrate 16 is not described in a limiting fashion.

Photoresist layer 22 is selected to have photochemical reactions in response to electromagnetic radiation 24 from a light source (not shown). Photoresist layer 22 is preferably a chemically amplified, positive tone, photoresist designed for 248 nm, 193 nm, 157 nm, or 13.4 exposure. In one embodiment, photoresist layer 22 is formed over substrate 16 by spin coating.

Radiation 24 is provided by a single light source or multiple light sources at various wavelength ranges depending on the material composition of photoresist layer 22. Radiation 24 can be emitted from an excimer laser, an ND:YAG laser, a frequency multiplied ND:YAG laser, a He—Ne scanning laser, or other light source. For example, radiation 24 can be radiation having a wavelength in the ultraviolet (UV), vacuum ultraviolet (VUV), deep ultraviolet (DUV), or extreme ultraviolet (EUV) range.

Radiation 24 is provided via a mask or reticle 26 in accordance with a pattern on mask or reticle 26 to photoresist layer 22. Mask or reticle 26 is a conventional mask or reticle including a transparent substrate 28 (e.g., fused silica) and an opaque or absorbing material 30 (e.g., chromium). Mask 26 provides a pattern of desirable features, such as, trenches, spaces, contacts, and/or vias, using material 30. Although not shown, there may also be other components or equipment provided between radiation 24 and portion 10 to transfer the image on mask 26 to photoresist layer 22, such as, an optical system (e.g., one or more lens assemblies).

In one embodiment, photoresist layer 22 is a positive resist material. Layer 22 and radiation 24 are selected to transfer the pattern or image provided on mask 26 to layer 22. Areas of layer 22 where radiation 24 is incident thereon (i.e., first exposed areas 32) undergo a photochemical reaction and become soluble. In a first developing step (FIG. 3), first exposed areas 32 are removed from portion 10, leaving behind apertures 34. First developing step utilizes a wet or dry developer. For example, a solvent developer, such as, tetramethylammonium hydroxide, can be selected to develop the material comprising layer 22.

In one embodiment, apertures 34 are circular, square, or rectangularly shaped. Each of apertures 34 is approximately the dimension of one lithographic feature that is consistent with the technology node.

Figure 4:
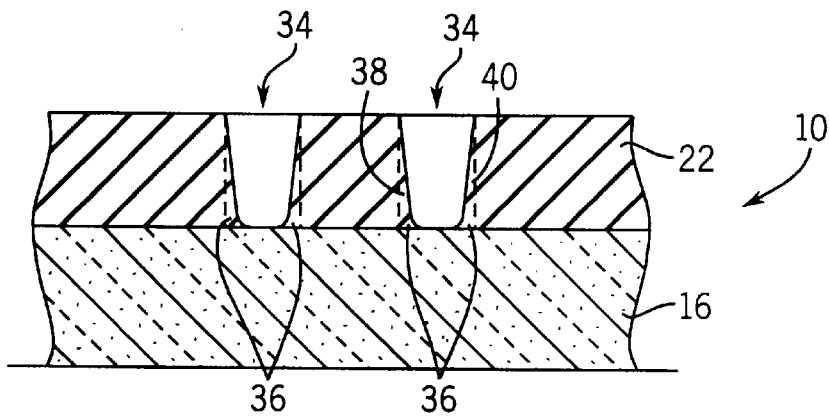
FIG. 4 is a cross-sectional view of the portion of the integrated circuit illustrated in FIG. 3, showing a first electron beam exposure step.

After the first developing step, a first electron-beam exposure step is performed on portion 10 (FIG. 4). A flood electron source, preferably of a cold cathode type, generates electrons from the energetic impact of ions to perform the first electron-beam exposure. Patterned layer 22 is flood electron beam exposed to create first shrink areas 36. The electron beam interacts with the molecules comprising layer 22, in particular, the molecules comprising the sidewalls of apertures 34, to the extent that these molecules are brought to a higher temperature sufficient to at least partially liquefy or plasticize layer 22. The sidewalls of each of apertures 34 in this liquefied or viscous state flow downward, due to gravity, to decrease the width of apertures 34.

Through careful selection of electron beam parameters, and additionally through selection of the material comprising layer 22, the melt and flow conditions associated with generation of areas 36 can be controlled. For example, the electron beam typically needs to come in contact with a given molecule in layer 22 to cause the heating of that molecule. Thus, the penetration distance or depth of the electron beam should be considered in generating areas 36.

By varying the electron beam energy, accelerating voltage, beam current, dose, processing gas, and/or substrate temperature, it is possible to control the penetration depth of the electron beam such that a curing depth and response of layer 22 can be controlled. The penetration depth of the electrons, comprising the electron beam, into a target material (i.e., layer 22) is a function of the electron beam energy, and the relationship is approximately given by:

$$R_g = \frac{0.046 V_a^{1.75}}{d}$$

where $R_g$ is the penetration depth in microns, $V_a$ is the accelerating voltage or energy in keV, and d is the density of the target material in g/cm$^3$.

Although not shown, formation of areas 36 may further include additional processing steps and/or equipment to ensure that desired areas 36 are formed in layer 22 without otherwise distorting the pattern transferred to layer 22 or substrate 16. For example, the sidewalls of apertures 34 may be cooled once flowing has commenced to specify the shape of areas 36. It is also contemplated that exposures other than electron beam exposure may be used to form areas 36, as long as the etched areas 12 etched from the pattern defined by areas 36 can be achieved, as described herein.

Areas 36 represent distortions to the morphology of apertures 34. These distortions, however, advantageously reduce the width of each of apertures 34, especially at the bottoms of apertures 34 (i.e., at the interface of layer 22 and substrate 16). In a cross-sectional view of portion 10, a pair of areas 36 (e.g., a left sidewall 38 and a right sidewall 40) form new sidewalls for each of apertures 34. Because left and right sidewalls 38, 40 both slope downwardly toward the bottom of a given aperture 34, the aperture width at the top of walls 38, 40 is larger than the aperture width at the bottom of walls 38, 40. For example, if the width of a given aperture 34 prior to the first electron beam exposure step is 150 nm, then the bottom width of a given aperture 34 with left and right sidewalls 38, 40 becomes 130 nm. Accordingly, after etching, the dimension of each of etched areas 12 is in the range of 120–130 nm and can approach a critical dimension of sub-100 nm.

Figure 5:
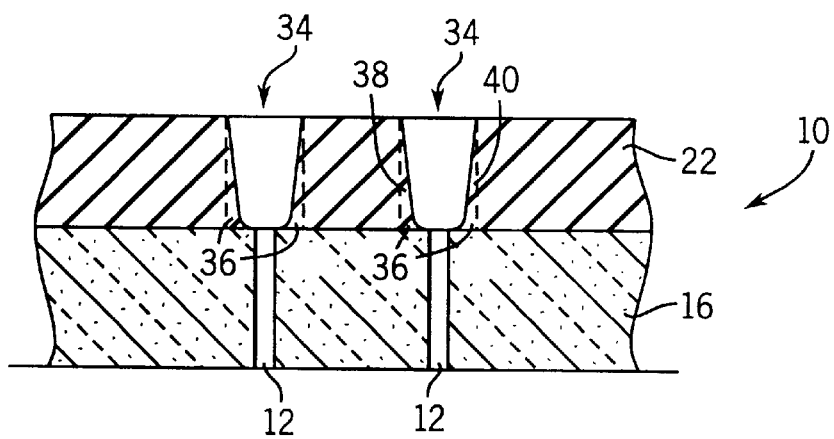
FIG. 5 is a cross-sectional view of the portion of the integrated circuit illustrated in FIG. 4, showing a first etching step.

Utilizing the pattern defined by areas 36 of layer 22, a first etching step performed on portion 10 forms etched areas 12 (FIG. 5). Areas 36 effectively pattern reduced or shrunken features, such as, etched areas 12 into substrate 16. For example, etched areas 12 can be contact holes, conductive vias, trenches, spaces, interconnects, or any other feature utilized in ICs or in the manufacture of ICs. The width or dimension of each of etched areas 12 is smaller than the width of any of apertures 34 without areas 36 (i.e., conventional holes patterned using merely a mask or reticle, such as mask 26). The width or dimension of each of etched areas 12 is determined by the bottom width of aperture 34, as defined by areas 36 (e.g., left and right sidewalls 38, 40).

Figure 11:
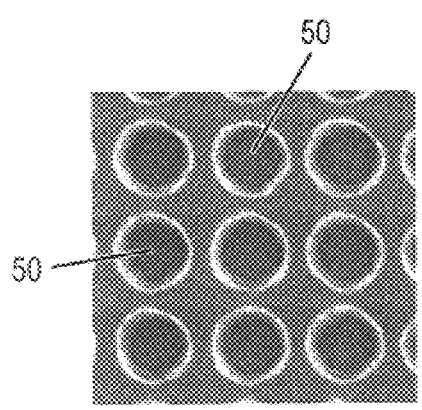
FIG. 11 is a top planar view of an SEM image of nominal contact holes.
Figure 12:
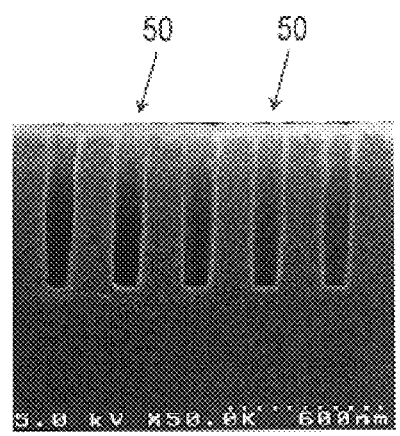
FIG. 12 is a cross-sectional view of an SEM image of the nominal contact holes of FIG. 11.

Shown in FIGS. 11–16 are scanning electron microscope (SEM) images of contact holes formed using an electron beam exposure step, such as the first electron-beam exposure step described above. FIG. 11 is a top planar SEM image of nominal contact holes 50, each having a diameter of approximately 150 nm. FIG. 12 is a cross-sectional view of nominal contact holes 50 of FIG. 11. Nominal contact holes 50 of FIGS. 11–12 are formed without an electron beam treatment and are shown for comparative purposes.

Figure 13:
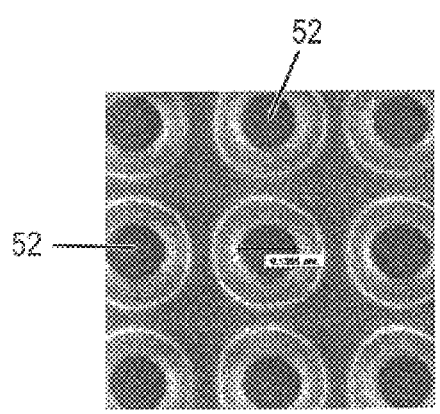
FIG. 13 is a top planar view of an SEM image of reduced contact holes formed from the first or second electron beam exposure step.
Figure 14:
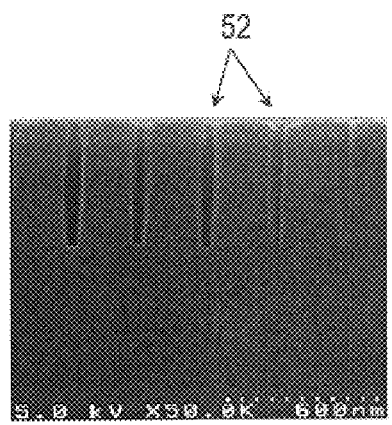
FIG. 14 is a cross-sectional view of an SEM image of the reduced contact holes of FIG. 13.
Figure 15:
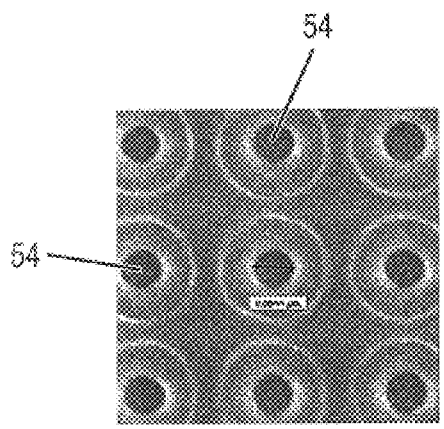
FIG. 15 is a top planar view of an SEM image of another reduced contact holes formed from the first or second electron beam exposure step.
Figure 16:
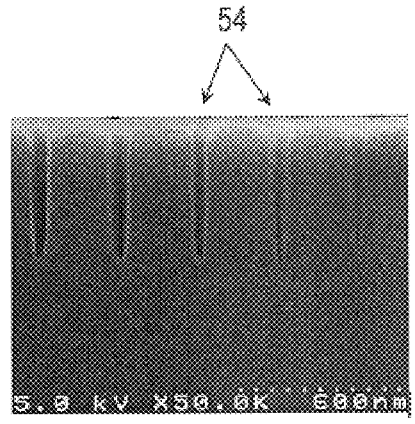
FIG. 16 is a cross-sectional view of an SEM image of the another reduced contact holes of FIG. 15.

In FIGS. 13–14, there is shown a top planar SEM image and a cross-sectional SEM image, respectively, of contact holes 52 formed by irradiation with -an electron beam having the following parameters: accelerating voltage=20 keV, beam current=4 mA, and dose=750 $\mu$C/cm$^2$. Under these conditions, it is possible to shrink the diameter or width of each of contact holes 52 from a nominal value of 150 nm to 130 nm, as shown. In FIGS. 15–16, contact holes 54 are formed by irradiating with an electron beam having the following parameters: accelerating voltage=20 keV, beam current=5 mA, and dose=1000 $\mu$C/cm$^2$. Under these conditions, the diameter or width of each of contact holes 54 shrinks from a nominal value of 150 nm to approximately 84 nm, as shown.

In one embodiment, electron beam parameters suitable to form suitable areas 36 to form the reduced widths in areas 12 (or suitable areas 48 to form the reduced widths in areas 14) are: accelerating voltage=approximately 5–20 keV, beam current=approximately 2–5 mA, and dose= approximately 500–2000 $\mu$C/cm$^2$. Because the width of each of areas 12 and 14 is dependent on the parameters of the applied electron beam in the first and second electron beam exposure steps, respectively, it is possible to achieve a wide range of reduced widths, as desired, and it is even possible to completely close apertures 34 or 46, i.e., the width of each of areas 12 and 14 equals zero, with an electron beam having aggressive enough beam parameters.

Figure 6:
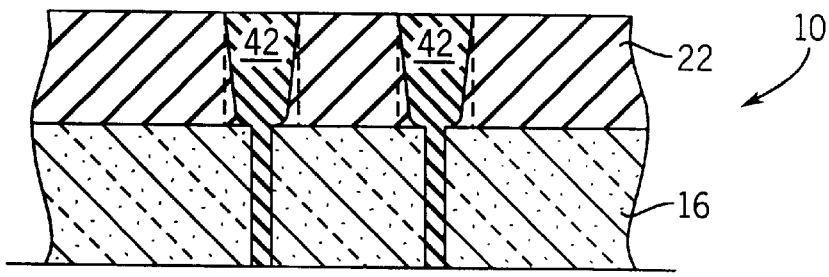
FIG. 6 is a cross-sectional view of the portion of the integrated circuit illustrated in FIG. 5, showing a second photoresist coating step.

With reference to FIG. 6, photoresist layer 22 (including areas 36) is not removed from etched portion 10. Instead, additional photoresist material is deposited or coated on substrate 16 and layer 22 such that etched areas 12 and apertures 34 of portion 10 are substantially filled with photoresist material 42. Preferably, photoresist material 42 is comprised of the same material as layer 22. This photoresist coating step permits portion 10 to be repatterned and additional lithographic processes to be performed thereon to fabricate reduced feature pitches in portion 10.

With reference to FIGS. 7–10, process steps similar to steps described with respect to FIGS. 2–5, respectively, are repeated on portion 10. However, in a second exposure step of FIG. 7, the position of the projected pattern of mask 26 onto the wafer with respect to portion 10 is different from the previous position of the projected pattern of mask 26 relative to portion 10 in the first exposure step of FIG. 2. The projected pattern of mask 26 is positioned relative to portion 10 such that the patterned feature positions on portion 10 do not coincide or align with the projected feature pattern provided on mask 26 during the second exposure step. This can be accomplished in the stepper, scanner, or exposure tool by incorporating appropriate translational displacements in the orientation of the projected mask image on photoresist layer 22. Additionally, if rotational adjustments are required, radial and/or angular displacements may also be made in the orientation of the projected mask image on photoresist layer 22. The accuracy of the new position of the projected image of mask 26 on portion 10 relative to the previous position can be verified with an overlay-matching tool, as is well-known in the art.

Figure 7:
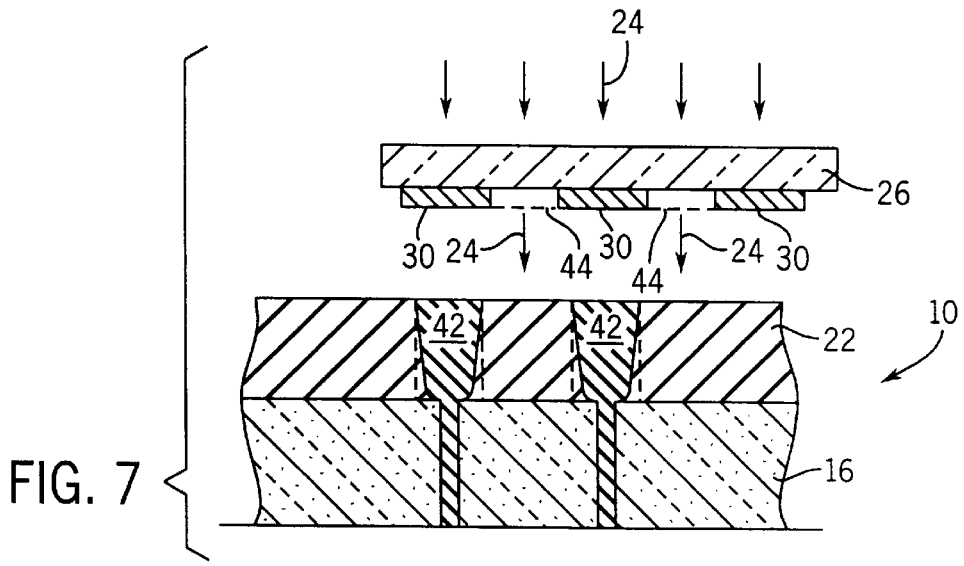
FIG. 7 is a cross-sectional view of the portion of the integrated circuit illustrated in FIG. 6, showing a second exposure step.

As can be seen in FIG. 7, the pattern provided on mask 26 is translated (e.g., left or right) relative to the previous pattern position for the first exposure step. Areas 44 in dotted lines indicate where the absorbing material 30 of mask 26 was positioned in the previous exposure step.

Figure 8:
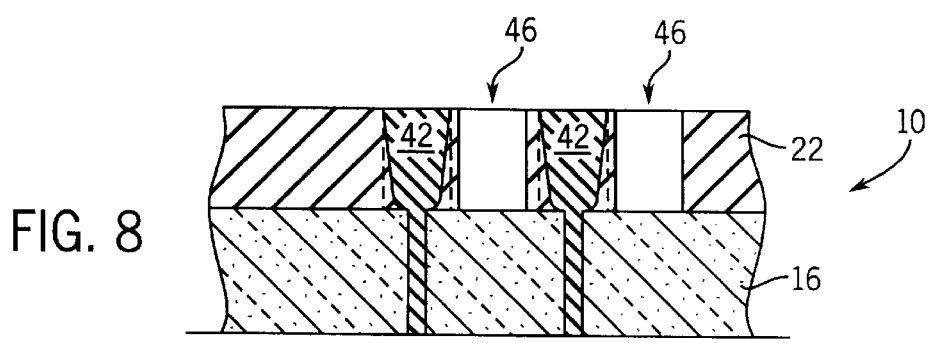
FIG. 8 is a cross-sectional view of the portion of the integrated circuit illustrated in FIG. 7, showing a second developing step.

After the second exposure step, a second developing step removes the exposed areas of layer 22 to form apertures 46 in layer 22 (FIG. 8). Each of apertures 46 is formed between two adjacent areas of photoresist material 42. Each of apertures 46 is similar to any of apertures 34 formed in the first developing step of FIG. 3.

Figure 9:
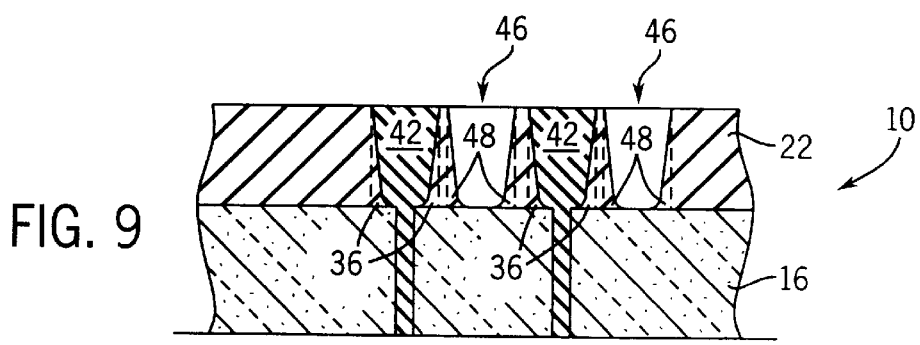
FIG. 9 is a cross-sectional view of the portion of the integrated circuit illustrated in FIG. 8, showing a second electron beam exposure step.

After apertures 46 have been formed, a second electron-beam exposure step is performed on portion 10 (FIG. 9). Similar to the first electron-beam exposure step described above, the flood exposure electron beam causes areas of layer 22, in particular, the sidewalls of each of apertures 46, to melt and flow to form second shrink areas 48. Areas 48 are similar to areas 36. Areas 48 permit substrate 16 to include smaller features than would otherwise be possible.

In FIG. 9, a given area 36 abuts a given area 48. It is contemplated that, in another embodiment, areas 36 and 48 may not abut each other.

Figure 10:
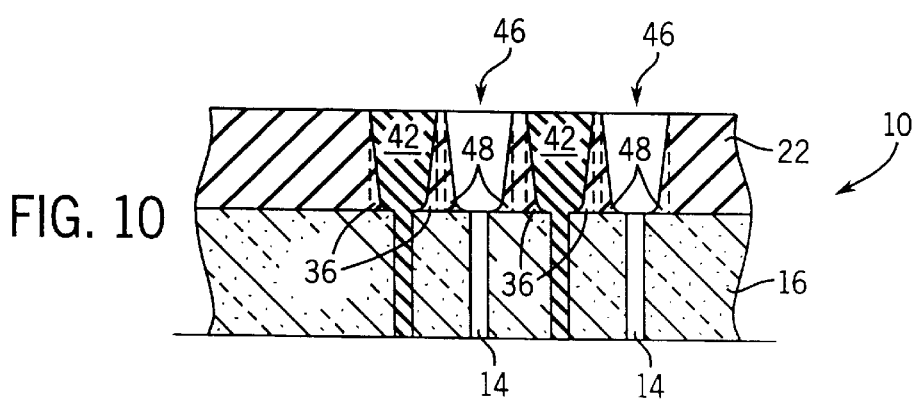
FIG. 10 is a cross-sectional view of the portion of the integrated circuit illustrated in FIG. 9, showing a second etching step.

After the formation of areas 48, a second etch step is performed on portion 10 to form etched areas 14 (FIG. 10). Etched areas 14 and etched areas 12 are similar to each other. The width of each of holes 48 reduced by formation of areas 48 is transferred or extended to substrate 16 as etched areas 14.

After etched areas 14 have been formed, all of layer 22, including areas 36 and 48, is removed from substrate 16. The patterned substrate 16 includes etched areas 12 and 14 (FIG. 1), which are more densely placed on substrate 16 than the pattern of mask 26. Furthermore, each of etched areas 12, 14 is reduced in dimension from what would have been achieved using the pattern of mask 26 and conventional lithographic techniques. Thus, not only has the dimension of features been reduced (e.g., each of etched areas 12, 14) in substrate 16, but the reduction of each feature permits an increase in the density of such features on substrate 16. In this manner, the conventional feature pitch (i.e., conventional pitch 18) has been reduced by at least a factor of two (i.e., as shown by reduced pitch 20).

It should be understood that the steps described with respect to FIGS. 6–10 may be performed one or more times on portion 10, in each cycle repositioning mask 26 to be translated from all the previous exposure steps, to form the desired reduced or shrunken features and feature pitches. The pitch may be reduced up to approximately one-half the wavelength of the exposure radiation (e.g., radiation 24). It should also be understood that although the description of the advantageous process has been related to formation of etched areas 12, 14 on substrate 16, the advantageous process may also be applied to form reduced non-etched areas and pitch.

It is understood that while the preferred embodiment and specific examples are given, they are for the purpose of illustration only and are not limited to the precise details described herein. For example, features other than contact holes, and vias, such as trenches, can benefit from the advantageous process. Various modifications may be made in the details within the scope and range of the equivalence of the claims without departing from what is claimed.

What is claimed is:

1. A method of fabricating reduced pitch in an integrated circuit, the integrated circuit including a patterned photoresist layer, the patterned photoresist layer being patterned in accordance with a pattern on a mask or reticle and exposure to a first radiation at a lithographic wavelength, the method comprising the steps of:

providing a second radiation to at least one area of the patterned photoresist layer, the patterned photoresist layer including a developed exposed area, the developed exposed area including sidewalls and a bottom;

transforming the sidewalls of the developed exposed area to change a width of the developed exposed area in response to the second radiation; and positioning the pattern on the mask or reticle relative to the patterned photoresist layer so that the pattern on the mask or reticle is not aligned with the patterned photoresist layer.

2. The method of claim 1, wherein the positioning step includes positioning the pattern on the mask or reticle translated from the mask or reticle position associated with the patterned photoresist layer.

3. The method of claim 1, further comprising:

providing the first radiation to the patterned photoresist layer after the positioning step; and additionally patterning the patterned photoresist layer in accordance with the mask or reticle positioned by the positioning step and the first radiation.

4. The method of claim 3, further comprising:

first etching a substrate provided under the patterned photoresist layer after the transforming step and before the positioning step, to form a first feature in the substrate; and second etching the substrate provided under the patterned photoresist layer after the additionally patterning step, to form a second feature in the substrate.

5. The method of claim 4, wherein a pitch between the first and second features is in the range of a sub-resolution limit of an exposure system associated with the first radiation.

6. The method of claim 1, wherein the second radiation is an electron beam.

7. The method of claim 6, wherein the providing a second radiation step includes providing the second radiation having electron beam parameters including an accelerating voltage in the range of approximately 5–20 keV, a beam current in the range of approximately 2–5 mA, and a dose in the range of approximately 500–2000 $\mu C/cm^2$.

8. The method of claim 1, wherein the transforming step includes at least partially liquefying the sidewalls of the developed exposed area.

9. The method of claim 8, wherein the transforming step includes moving the at least partially liquefied sidewalls.

10. An integrated circuit fabrication process, the process comprising:

changing a first aperture formed on a photoresist layer provided over a semiconductor substrate; and forming a second aperture on the photoresist layer in accordance with a mask or reticle used to form the first aperture, wherein the mask or reticle is not in alignment with the first aperture formed on the photoresist layer, and wherein the first aperture defines a first feature in the substrate and the second aperture defines a second feature in the substrate.

11. The process of claim 10, wherein the changing step includes providing a flood electron beam to reduce a width associated with the first aperture.

12. The process of claim 11, wherein the flood electron beam is provided at an accelerating voltage in the range of approximately 5–20 keV, a beam current in the range of approximately 2–5 mA, and a dose in the range of approximately 500–2000 $\mu C/cm^2$.

13. The process of claim 10, wherein the changing step includes at least partially liquefying sidewalls of the first aperture.

14. The process of claim 13, wherein the at least partially liquefied sidewalls flow downward and solidifies to determine the width of the first feature.

15. The process of claim 10, wherein the first and second features are substantially similar to each other, and each of the first and second features has a width less than one lithographic feature.

16. The process of claim 10, wherein a pitch between the first and second features is less than a pitch between adjacent first features or adjacent second features.

17. The process of claim 10, further comprising:

filling the first aperture and first feature with photoresist material before the step of forming a second aperture on the photoresist layer.

18. An integrated circuit fabrication process, the process comprising:

(a) reducing a width associated with a current patterned area in a photoresist layer provided over a substrate, the current patterned area formed using a mask or reticle;

(b) patterning the substrate in accordance with the reduced width current patterned area in the photoresist layer, to form a current set of features in the substrate;

(c) moving the mask or reticle relative to the current patterned area and transferring a pattern on the mask or reticle onto the photoresist layer to form the next current set of features in the substrate; and (d) repeating steps (a)–(c) a plurality of times, as desired, wherein all of the sets of features are similar to each other, a density of the features formed on the substrate is greater than a density of the features provided as the pattern on the mask or reticle, and the reducing step includes melting and flowing sidewalls of the current patterned area.

19. The process of claim 18, wherein the reducing step (a) includes an electron beam incident on the photoresist layer.

20. The process of claim 18, wherein a distance between any adjacent features in one set is greater than a distance between adjacent features from two different sets.

21. The process of claim 18, wherein a distance between two nearest features is approximately one half a wavelength of a radiation used to transfer the pattern on the mask or reticle to the photoresist layer.

22. The process of claim 18, wherein a density of features formed on the substrate is greater than a density of features imaged on the mask or reticle.

23. The process of claim 18, further comprising:

providing a photoresist material in the current patterned area before performing step (c).

24. An integrated circuit fabrication method, the method comprising:

forming a first aperture in a photoresist layer provided above a semiconductor substrate in accordance with a pattern provided in a mask or reticle;

reducing the width of the first aperture by providing an electron beam to a portion of the first aperture;

patterning the semiconductor substrate in accordance with the first aperture after the step of reducing the width of the first aperture to form a first substrate feature;

providing a photoresist material in the first aperture and the first substrate feature; and moving the mask or reticle relative to the first aperture and forming a second aperture in the photoresist layer in accordance with the pattern provided in the mask or reticle.

25. The method of claim 24, further comprising:

patterning the semiconductor substrate in accordance with the second aperture to form a second substrate feature.

26. The method of claim 25, further comprising:

reducing the width of the second aperture by providing an electron beam to a portion of the second aperture prior to the step of patterning the semiconductor substrate to form a second substrate feature.

27. The method of claim 25, further comprising:

removing the photoresist layer and the photoresist material provided in the first aperture and the first substrate feature.

28. The method of claim 24, wherein the step of reducing the width of the first aperture comprises at least partially liquefying the sidewalls of the first aperture.

\* \* \* \* \*